(12) United States Patent
Zhuang et al.

(10) Patent No.: US 10,211,018 B2
(45) Date of Patent: Feb. 19, 2019

(54) PIVOT SUPPORTING STRUCTURE AND CIRCUIT BREAKER

(71) Applicant: ABB Schweiz AG, Baden (CH)

(72) Inventors: Zhijian Zhuang, Fujian (CN); Xin Ye, Fujian (CN); Luciano Chenet, Torre Boldone (IT)

(73) Assignee: ABB Schweiz AG, Baden (CH)

(*) Notice: Subject to any disclaimer, the term of this patent is extended or adjusted under 35 U.S.C. 154(b) by 12 days.

(21) Appl. No.: 15/593,850

(22) Filed: May 12, 2017

(65) Prior Publication Data

US 2017/0250047 A1    Aug. 31, 2017

Related U.S. Application Data

(63) Continuation of application No. PCT/CN2014/090921, filed on Nov. 12, 2014.

(51) Int. Cl.
*G01R 31/327* (2006.01)
*H01H 71/02* (2006.01)
(Continued)

(52) U.S. Cl.
CPC ........... *H01H 71/0264* (2013.01); *G01L 1/22* (2013.01); *G01R 31/3274* (2013.01);
(Continued)

(58) Field of Classification Search
CPC ............... H01H 1/0015; H01H 33/008; H01H 11/0062; H01H 71/0264;
(Continued)

(56) References Cited

U.S. PATENT DOCUMENTS

| 4,433,293 A | * | 2/1984 | Aoyagi | H01H 11/0062 |
| | | | | 200/81.5 |
| 6,002,560 A | * | 12/1999 | Nguyen | H01H 1/0015 |
| | | | | 361/115 |

(Continued)

FOREIGN PATENT DOCUMENTS

| CN | 1687801 A | 10/2005 |
| CN | 201440110 U | 4/2010 |

(Continued)

OTHER PUBLICATIONS

State Intellectual Property Office of P.R. China, International Search Report and Written Opinion issued in corresponding Application No. PCT/CN2014/090921, dated Jun. 29, 2015, 12 pp.

(Continued)

*Primary Examiner* — Felix O Figueroa
(74) *Attorney, Agent, or Firm* — Taft Stettinius & Hollister

(57) ABSTRACT

A pivot supporting structure for a circuit breaker and a circuit breaker. The pivot supporting structure includes: a supporting body having a supporting hole for receiving and pivotally supporting a pivot pin connected to an actuating mechanism of the circuit breaker, wherein at least one strain gauge are mounted to the supporting body for sensing the force acting on the pivot supporting structure by the actuating mechanism. This pivot supporting structure can accurately sense the characteristic force applied, such that the contact force and mechanical characteristics of the circuit breaker can be on-line monitored.

17 Claims, 4 Drawing Sheets

(51) Int. Cl.
*H01H 11/00* (2006.01)
*G01L 1/22* (2006.01)
*H01H 33/00* (2006.01)
*H01H 1/00* (2006.01)
*H01H 33/666* (2006.01)

(52) U.S. Cl.
CPC ...... *H01H 11/0062* (2013.01); *H01H 33/008* (2013.01); *H01H 1/0015* (2013.01); *H01H 2033/6667* (2013.01); *H01H 2239/052* (2013.01)

(58) Field of Classification Search
CPC ..... H01H 2033/6667; H01H 2239/052; G01R 31/3274; G01L 1/22
See application file for complete search history.

(56) References Cited

U.S. PATENT DOCUMENTS

| | | | |
|---|---|---|---|
| 9,378,901 B2 * | 6/2016 | Ashtekar | H01H 1/0015 |
| 2016/0225543 A1 | 8/2016 | Ashtekar et al. | |

FOREIGN PATENT DOCUMENTS

| | | |
|---|---|---|
| CN | 201465883 U | 5/2010 |
| CN | 102269650 A | 12/2011 |
| CN | 203630307 U | 6/2014 |
| EP | 2405454 A1 | 1/2012 |
| EP | 2581753 A1 | 4/2013 |
| GB | 2475081 A | 5/2011 |
| JP | 2004158302 A | 6/2004 |
| WO | 2001050563 A1 | 7/2001 |
| WO | 2016049825 A1 | 4/2016 |

OTHER PUBLICATIONS

Extended European Search Report, European Patent Application No. 14905832.3, dated Jun. 1, 2018, 6 pages.
Chinese Office Action, Chinese Patent Application No. 201480081673.2, dated Sep. 20, 2018, 18 pages including machine translation in English.
Chinese Search Report, Chinese Patent Application No. 201480081673.2, dated Sep. 20, 2018, 4 pages including machine translation in English.

* cited by examiner

PIVOT SUPPORTING STRUCTURE AND CIRCUIT BREAKER

FIELD OF INVENTION

Embodiments of the present disclosure relate to the field of a circuit breaker, and in particular to a pivot supporting structure for a circuit breaker to facilitate on-line monitoring the mechanical characteristics of the circuit breaker.

BACKGROUND ART

In recent several years, more and more experts pay much attention to research and development on mechanical characteristic monitoring of a circuit breaker. The dynamic characteristics of a circuit breaker can reflect the running failure of the circuit breaker effectively. Therefore, the mechanical characteristic is considered as one of the most important features for a circuit breaker, and there is a requirement to monitor the mechanical characteristic of a circuit breaker.

Currently, mechanical characteristic monitoring of a circuit breaker is usually taken in an off-line environment by means of electronic sensors. The off-line environment may be a testing environment in which the circuit breaker is not electrically connected to the grid and thus would not subject the high voltage in the grid. The voltage for testing in the testing environment is relative low such that it would not impact the normal operation of the electronic sensors. However, since the circuit contact in off-line or testing environment does not subject the real high voltage, the monitored result can not accurately reflect the practical operation condition of the circuit breaker and thus can only act as a limited reference for studying the circuit breaker.

As the smart grid technology develops, there is a demand for intelligent circuit breakers which can on-line monitor the mechanical characteristic of the circuit breakers in their normal operation condition so as to support the functions of the smart grid. On-line monitoring can reflect the real operation condition of the circuit breaker, and thus is more useful in studying and controlling the circuit breaker.

One of the most important mechanical characteristics of a circuit breaker is the value of a contact force applied on a movable contact of the circuit breaker, especially during the closing period. This contact force is a basis for evaluating the other aspects of the mechanical characteristics of the circuit breaker, for example, the accurate closing and opening time point of the circuit breaker.

However, the current off-line monitoring method is not suitable for on-line monitoring the contact force. The high voltage of the grid in the on-line environment can easily damage the electronics for the off-line monitoring.

In addition, since the electrical closing and opening time point under the high voltage cannot represent the real mechanical closing and opening of the movable contact due to the breakdown conducting under high voltage, it is necessary to find the mechanical closing and opening time point of the movable contact in the operation condition of the circuit breaker so as to accurately monitoring the mechanical characters of the circuit breaker. However, it is difficult to directly monitor the accurate mechanical closing and opening time point of a circuit breaker under the high voltage.

Therefore, a method and device for on-line monitoring the mechanical characteristic of a circuit breaker, particularly for on-line monitoring the accurate contact force and the mechanical closing and opening time point is required.

SUMMARY OF INVENTION

Hence, in order to overcome one or more of the deficiencies in the prior art mentioned above, one of objectives of embodiments of the present disclosure is to provide a pivot supporting structure for a circuit breaker and a circuit breaker having such pivot supporting structure.

According to one aspect of the embodiments of the present disclosure, there is provided a pivot supporting structure for a circuit breaker, comprising: a supporting body having a supporting hole for receiving and pivotally supporting a pivot pin connected to an actuating mechanism of the circuit breaker. At least one strain gauge are mounted to the supporting body for sensing the force acting on the pivot supporting structure by the actuating mechanism.

According to one aspect of the embodiments of the present disclosure, the supporting body further comprises a sensing hole, and the at least one strain gauge are mounted to the inner wall of the sensing hole.

According to one aspect of the embodiments of the present disclosure, the supporting body defines a longitudinal direction and further comprises a mounting structure for fixing the supporting body to the circuit breaker, with the longitudinal direction of the supporting body aligning with the vertical direction of the circuit breaker. The sensing hole is arranged between the mounting structure and the supporting hole in the longitudinal direction.

According to one aspect of the embodiments of the present disclosure, the at least one strain gauge comprises two tensile strain gauges for sensing the tensile force acting on the pivot supporting structure and two compressive strain gauges for sensing the compressive force acting on the pivot supporting structure. The two tensile strain gauges and the two compressive strain gauges are mounted to the inner wall of the sensing hole in an orientation such that they are adapted to sense the force in the longitudinal direction. The strain gauges can be mounted (i.e. attached) to the supporting body in any common manner, for example, by glue.

According to one aspect of the embodiments of the present disclosure, the two tensile strain gauges are mounted to the inner wall of the sensing hole at one side in the longitudinal direction, with the two tensile strain gauges being symmetrical with respect to a virtual line which passes the center of the sensing hole and is parallel to the longitudinal direction, and the two compressive strain gauges are mounted to the inner wall of the sensing hole at another side in the longitudinal direction, with the two compressive strain gauges being symmetrical with respect to said virtual line.

According to one aspect of the embodiments of the present disclosure, the two tensile strain gauges and the two compressive strain gauges are connected as a Wheatstone bridge, with the two tensile strain gauges being not connected directly, and the two compressive strain gauges being not connected directly. In other words, the tensile strain gauges and the compressive strain gauges are connected alternately, such that the two bridge arms of the Wheatstone bridge each has one tensile strain gauge and one compressive strain gauge, and the sequence of the one tensile strain gauge and one compressive strain gauge in one arm is different from that in the other arm.

According to one aspect of the embodiments of the present disclosure, slots are arranged on the supporting body to improve the flexibility of a portion of the supporting body around the sensing hole under the force acting on the supporting hole.

According to one aspect of the embodiments of the present disclosure, the pivot supporting structure further comprises a printed circuit board connected and fixed to the supporting body. The printed circuit board is configured to calculate the value of the force acting on the pivot supporting structure based on the variation in the resistance of the at least one strain gauge and transmit the calculated value of the force.

According to one aspect of the embodiments of the present disclosure, the printed circuit board is further configured to calculate a contact force applied on a movable contact of the circuit breaker and/or evaluate the closing and opening time point of the circuit breaker, based on the calculated value of the force acting on the pivot supporting structure.

According to one aspect of the embodiments of the present disclosure, the printed circuit board is further configured to receive and forward outputs from another device connected to a communication port of the printed circuit board.

According to one aspect of the embodiments of the present disclosure, the pivot supporting structure further comprises a holder to further support and protect the printed circuit board.

According to one aspect of the embodiments of the present disclosure, a circuit breaker is further provided, comprising an actuating mechanism for actuating a movable contact of the circuit breaker and the pivot supporting structure according to any of the preceding embodiments. The supporting body of the pivot supporting structure is fixed to a base of the circuit breaker, and the supporting hole of the pivot supporting structure is coupled to a lever of the actuating mechanism via a pin. The pivot supporting structure is fixed to the circuit breaker so as to sense the force in the vertical direction relative to the base of the circuit breaker acting on the pivot supporting structure by the lever of the actuating mechanism.

According to one aspect of the embodiments of the present disclosure, the circuit breaker further comprises a data processing unit connected to the pivot supporting structure. The data processing unit is configured to calculate a contact force applied on the movable contact of the circuit breaker and/or evaluate the closing and opening time point of the circuit breaker, based on the value of the sensed force from the pivot supporting structure.

Since the force sensor (strain gauge) is integrated with the supporting structure of the actuating mechanism of the circuit breaker, and the sensor and the supporting structure would not move during the operation of the circuit breaker, the sensing result would be more accurate, and the sensor can withstand larger times of operations. In addition, since the sensor is not mounted to any movable actuating element, the disassembling of the sensor would not change the mechanical characteristics of the circuit breaker, and thus the sensor is easy for maintenance. The integration of the sensor and the printed circuit board facilitates the accurate calculation of the force value and digital transmitting of the force value.

Since the accurate time point of closing or opening of the circuit breaker can be determined by sensing the characteristic forces on the supporting structure of the circuit, the sensing electronics and the sensing process would not be impacted by the severe environment, such as high voltage, complex magnetic field and arc discharge, near the movable contact. As a result, the monitoring to the time point of closing or opening of the circuit breaker can be taken during the not vial operation of the circuit breaker.

BRIEF DESCRIPTION OF THE DRAWINGS

When reading the following detailed description on the exemplary embodiments with reference to the drawings, the aim, features and advantages of the present disclosure become obvious, wherein.

DETAILED DESCRIPTION OF EMBODIMENTS

Figure 1:
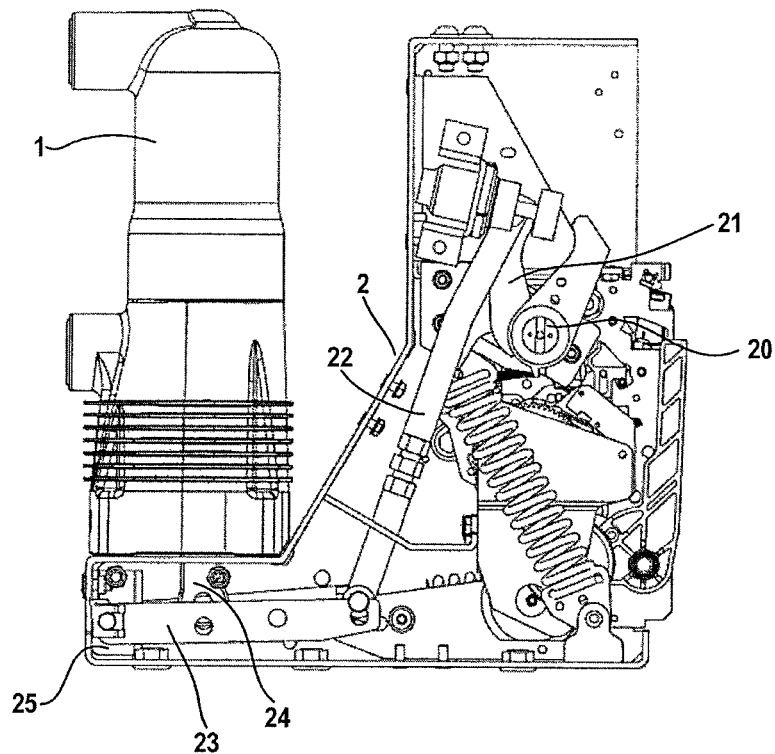
FIG. 1 illustrates an exemplary circuit breaker which can be on-line monitored by the method according to an embodiment of the present invention.

Hereinafter, exemplary embodiments will be referred to in describing the mechanism and spirit of the present disclosure. It should be understood that these embodiments are merely provided to facilitate those skilled in the art in understanding and in turn implementing the present disclosure, but not for limiting the scope of the present disclosure in any way.

Various embodiments of the present disclosure are described in detail herein in an exemplary way by referring to the drawings.

FIG. 1 illustrates an exemplary circuit breaker which can be on-line monitored by the method according to an embodiment of the present invention. The circuit breaker as shown in FIG. 1 is a high voltage circuit breaker, comprising a stationary contact and a movable contact (not shown) enclosed in an insulation sleeve 1, and an actuating mechanism 2 for actuating the closing and opening action of the movable contact. The actuating mechanism 2 is usually a linkage mechanism for transmitting a driving force from an active element for example, a motor or a spring actuator, to the movable contact. As shown in FIG. 1, the linkage mechanism comprises a first lever 21, a second lever 22, a third lever 23 pivotally connected to each other in sequence. The first lever 21 is connected to a driving shaft 20 driven by an active element, and the third lever 23 is pivotally connected to a pivot supporting structure 25 on the base of the circuit breaker. A push rod 24 on one end is pivotally connected to the movable contact at a distance from the pivot point between the third lever 23 and the pivot supporting structure 25. The other end of the push rod 24 is connected to the movable contact in the insulation sleeve 1. By driving the driving shaft 20 rotating via a motor or a spring, the movable contact can be moved up and down in a longitudinal direction in the sleeve 1 by the force transmission from the first lever 21, the second lever 22, the third lever 23 and the push rod 24, so as to contact or be separated from the stationary contact and thus close or open the circuit.

Since there is a severe environment inside the insulation sleeve 1 involving high voltage, high magnetic field and pre-arcing between the contacts, it is not practical to arrange electronic sensors near the contacts to sensor the parameter of the contacts for determining the time point when the movable contact is just closing or opening during closing or opening operation. The bounce of the movable contact during the closing and opening period further aggravate the difficulty of determining the definite time point of closing or opening of the movable contact based on any possible sensed data. The present invention is based on the insight that a significant force variation would occur as a transient on the movable contact and the driving mechanism during the closing and opening of the circuit breaker, due to the change of the counter force applied by the stationary contact to the movable contact.

Figure 2:
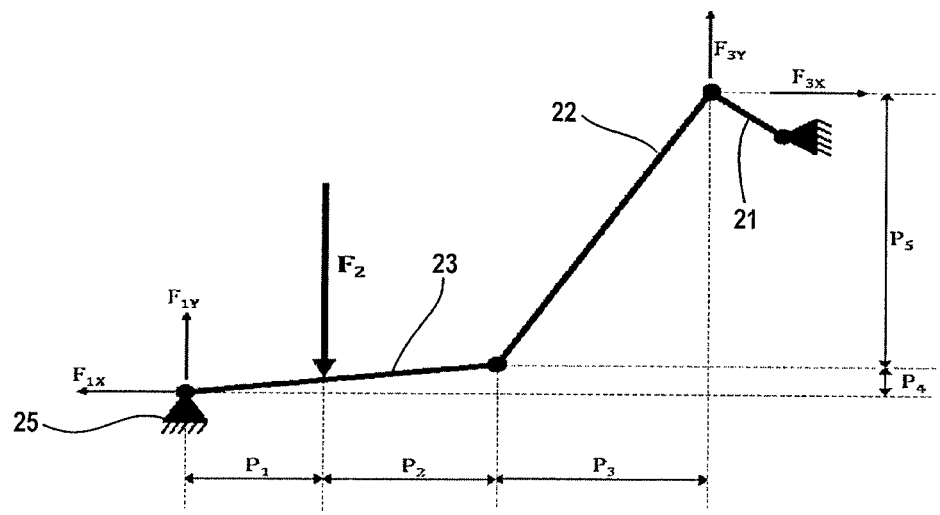
FIG. 2 illustrates the force applied on the linkage mechanism of the circuit breaker as shown in FIG. 1.

FIG. 2 illustrates the force applied on the linkage mechanism of the circuit breaker as shown in FIG. 1. In a balanced closed state of the circuit breaker, the movable contact abuts against the stationary contact under a force from the linkage mechanism. In this case, the stationary contact would apply a counter force $F_2$ (also referred to as contact force) on the movable contact which is in turn conducted to the third lever 23 through the push rod 24. Once the movable contact is separated from the stationary contact in the opening period, the counter force $F_2$ on the movable contact, the push rod 24 and the third lever 23 would decrease dramatically and even become zero. Likewise, during the closing period of the circuit breaker, the counter force $F_2$ applied on the movable contact by the stationary contact would dramatically increase from zero to a relative high value. It appears that the variation of the counter force $F_2$ applied on the push rod 24 or third lever 23 can act as a characteristic to reflect the closing and opening process of the circuit breaker. Furthermore, it can be reasonably supposed that at the time point when the movable contact just begins to contact the stationary contact, the first transient increase of the value of the counter force $F_2$ in the closing period would occur for the first time; and at the time point when the movable contact just begins to be separated from the stationary contact, the first transient decrease of the value of the counter force $F_2$ in the opening period would occur for the first time.

Based on the above observations, it is advantageous to determine the time point of closing and opening for the circuit breaker by identifying the variation of the counter force $F_2$.

According to an embodiment of the present invention, a method for monitoring a circuit breaker is provided. The method comprises the following steps: obtaining a characteristic force associated with the actuating mechanism of the circuit breaker (in this embodiment, the contact force which is directly applied on a linkage mechanism of the actuating mechanism by a movable contact of the circuit breaker); and determining the time point when the closing and/or opening of the circuit breaker occurs by identifying a variation of the force. In particular, when a variation increase of the characteristic force occurs, the corresponding time point is determined as the time point of the closing of the circuit breaker; and when a variation decrease of the characteristic force occurs, the corresponding time point is determined as the time point of the opening of the circuit breaker.

The contact force or counter force $F_2$ can be sensed in different positions. For example, the contact force $F_2$ can be sensed on the push rod 24 by a force sensor disposed on the push rod 24. The force sensor can be a strain gauge connected to a measuring circuit. The strain gauge is actually a variable resistor which can deform along with the strain on the object to which the strain gauge is mounted. When a force is applied on the object, the strain gauge would deform and the resistance value of the strain gauge would change. By means of a measuring circuit, the changing resistance of the strain gauge can result in a change in an electrical signal, which can represent the value of the corresponding force. In order to amplify the strain on the push rod 24 for facilitating the measuring, some elastic structures can be provided on the push rod 24 where the strain gauge is mounted, such as some slots. These elastic structures improve the deformation rate of the push rod 24 where the strain gauge is mounted, such that the strain due to the contact force $F_2$ can be amplified and thus is easier to be accurately sensed. With the measuring circuit connected to the strain gauge, the contact force $F_2$ can be computed based on the sensed strain and the known deformation rate.

In an embodiment, the contact force $F_2$ can also be sensed on a position on the third lever 23 where the push rod 24 is connected to the third lever 23, or on the pivot shaft connecting the push rod 24 and the third lever 23. These positions are all isolated and away from the movable contact such that the sensing would not be significantly impacted by the severe environment in the isolating sleeve 1, and the sensing means is prevented from suffering and being damaged by the severe environment.

Further referring to FIG. 2, in the balanced closed state, the linkage mechanism also subjects other forces, such as the counter force from the external support structures and the interacting force from the adjacent levers. For example, taking the second lever 22 and the third lever 23 as a system, in addition to the contact force $F_2$, this system further subjects the following forces: the end of the third lever 23 connected to the pivot supporting structure 25 subjects the counter force $F_1$ from the pivot supporting structure 25 which can be divided into a component $F_{1x}$ perpendicular to the direction of the contact force $F_2$ and a component $F_{1y}$ in the direction of the contact force $F_2$; the end of the second lever 22 connected to the first lever 21 subjects the acting force $F_3$ from the first lever 21 which can be divided into a component $F_{3x}$ perpendicular to the direction of the contact force $F_2$ and a component $F_{3y}$ in the direction of the contact force $F_2$. In the balanced closed state, the system comprising the second lever 22 and the third lever 23 should meet the following three balance conditions so as to be kept in the static balance state: the resultant force in a X direction (the direction perpendicular to the contact force $F_2$) subjected by the system is equal to zero; the resultant force in a Y direction (the direction of the contact force $F_2$) subjected by the system is equal to zero; and the resultant torque subjected by each lever in the system is equal to zero.

Based on the above three conditions, the following four equations can be obtained:

$$F_{1x}=F_{3x};$$

$$F_{1y}+F_{3y}=F_2;$$

$$F_{3y}\cdot P_3=F_{3x}\cdot P_5;$$

$$F_2\cdot P_1+F_{3x}\cdot P_4=F_{3y}\cdot(P_1+P_2).$$

wherein: the parameters $P_1$, $P_2$, $P_3$, $P_4$ and $P_5$ refer to the distances as marked in FIG. 2.

After transforming the above equations, obtaining:

$$F_{1x} = F2 \cdot \frac{P_1}{\left(P_1 + P_2 - \frac{P_3 P_4}{P_5}\right)} \cdot \frac{P_3}{P_5} \quad (1)$$

$$F_{1y} = F2 \cdot \left(1 - \frac{P_1}{\left(P_1 + P_2 - \frac{P_3 P_4}{P_5}\right)}\right) \quad (2)$$

$$F_{3x} = F2 \cdot \frac{P1}{\left(P_1 + P_2 - \frac{P_3 P_4}{P_5}\right)} \cdot \frac{P_3}{P_5} \quad (3)$$

$$F_{3y} = F2 \cdot \frac{P_1}{\left(P_1 + P_2 - \frac{P_3 P_4}{P_5}\right)} \quad (4)$$

From the above results (1)-(4), it appears that supposing all the distances $P_1$-$P_5$ are constant, the forces $F_{1x}$, $F_{1y}$, $F_{3x}$ and $F_{3y}$ are all linearly relevant to the contact force $F_2$. Considering the rather small change in the distances $P_1$-$P_5$ during the very small movement of the movable contact in a short closing or opening period in which the movable contact is nearly contacting or leaving the stationary contact, the forces $F_{1x}$, $F_{1y}$, $F_{3x}$ and $F_{3y}$ can be considered as approximately linearly relevant to the contact force $F_2$ during the period in which the movable contact is nearly contacting or leaving the stationary contact. In this case, the change in the forces $F_{1x}$, $F_{1y}$, $F_{3x}$ and $F_{3y}$ can also be used to reflect the change in the contact force $F_2$ and thus reflect the closing and opening process of the circuit breaker.

In an embodiment, by obtaining any of the forces $F_{1x}$, $F_{1y}$, $F_{3x}$ and $F_{3y}$, and taking any of the forces $F_{1x}$, $F_{1y}$, $F_{3x}$ and $F_{3y}$ as the characteristic force, and identifying a variation of any of the forces $F_{1x}$, $F_{1y}$, $F_{3x}$ and $F_{3y}$, the time point of closing and opening of the circuit breaker can also be determined.

In an embodiment, it is also possible to further measure the distances $P_1$-$P_5$ in the balanced closed state of the movable contact, and compute the contact force $F_2$ with any of the sensed forces $F_{1x}$, $F_{1y}$, $F_{3x}$ and $F_{3y}$, and the distances $P_1$-$P_5$ by means of the above results (1)-(4). After that, the computed contact force $F_2$ can further be used as the characteristic force to determine the time point of closing and opening of the circuit breaker as described before.

In fact, the whole linkage mechanism or any other possible actuating mechanism of a circuit breaker would be affected by the contact force $F_2$. Any force applied on the linkage mechanism or by the linkage mechanism would change in response to the change in the contact force $F_2$. Therefore, in theory, any force associated with the linkage mechanism can be used as a characteristic force to be directly sensed and used to determine the closing and opening time point. The force which can be used as the characteristic force at least comprises:

the contact force F2;
an internal force subjected by any rod of a linkage mechanism of a actuating mechanism;
a resultant force subjected by either end of any rod of the linkage mechanism;
a component of the resultant force subjected by either end of any rod of the linkage mechanism, which component is in the direction of the contact force;
a component of the resultant force subjected by either end of any rod of the linkage mechanism, which component is perpendicular to the direction of the contact force;
a resultant force subjected by any pivot point for the linkage mechanism;
a component of the resultant force subjected by any pivot point for the linkage mechanism, which component is in the direction of the contact force;
a component of the resultant force subjected by any pivot point for the linkage mechanism, which component is perpendicular to the direction of the contact force.

In order to sense the force applied on the linkage mechanism or by the linkage mechanism, the strain gauge should be mounted to the corresponding positions. For example, the strain gauge can be mounted on any lever along the longitudinal direction of the lever to sense the internal stress on the lever; the strain gauge can be mounted on the end of any lever to sensor the force (X component, Y component or the resultant force) applied on the end of the lever by other connected part. It is advantageous to attach the strain gauge on any pivot point (such as the pivot supporting structure 25) to sense the force applied by the linkage mechanism which has the same value as the force applied on the linkage mechanism in the same point and can also be used to determine the closing and opening time point. Since the strain gauge is mounted to a stationary structure (the pivot supporting structure 25 is stationary relative to the circuit breaker), the strain gauge would not be moved, such that the strain gauge can be mounted more firmly, and the sensing precision would be higher without the impact of the movement of the strain gauge.

In order to accurately reflect the change in the contact force $F_2$, the other forces acting as the characteristic forces should has a high linearity and sensitivity with respect to the contact force $F_2$. Normally, the force in the direction of the contact force $F_2$ would have more linearity and sensitivity with respect to the contact force $F_2$ compared to the forces in other directions. For the linkage mechanism as shown in FIG. 2, the Y component $F_{1y}$ of the counter force $F_1$ and the Y component of the acting force $F_3$ are in the direction of the contact force $F_2$, and have high linearity and sensitivity with respect to the contact force $F_2$. Therefore, it is advantageous to directly sense the force $F_{1y}$ or $F_{3y}$ as the characteristic force to determine the time point of closing and opening. Experiment result shows the force $F_{1y}$ has higher linearity and sensitivity compared to $F_{3y}$. In this regard, it is further advantageous to attach the strain gauge on the pivot supporting structure 25 to sense $F_{1y}$ as the characteristic force.

In view of above, it appears it is particularly advantageous to attach the strain gauge on the pivot supporting structure 25 to sense the vertical force applied on the pivot supporting structure 25 by the linkage mechanism. It is appreciated that this vertical force applied on the pivot supporting structure 25 is equal to the vertical component $F_{1y}$ of the counter force $F_1$ in value but with reverse direction. Therefore, the value of this vertical force applied on the pivot supporting structure 25 can be advantageously considered as the value of the vertical component $F_{1y}$ of the counter force $F_1$. With this sensed force value, the contact force $F_2$ can be calculated by means of the above equations (1)-(4) to monitor the closing and opening time point of the movable contact. This sensed force value can also be used to directly monitor the closing and opening time point of the movable contact, by monitoring the transient of the value over the time, as discussed above.

Figure 3:
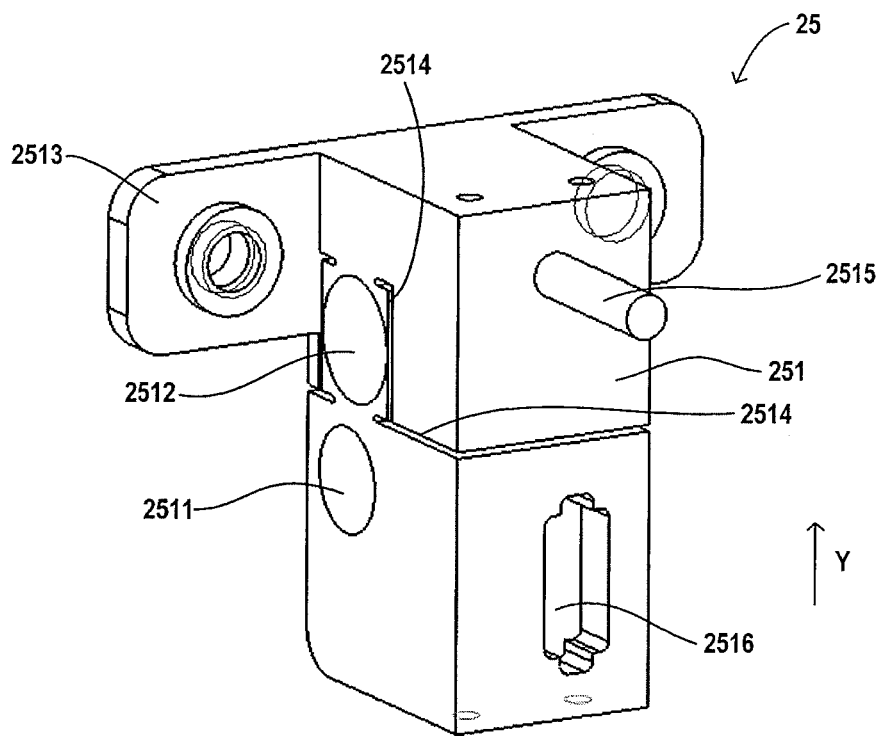
FIG. 3 illustrates a perspective view of the supporting body of a pivot supporting structure according to an embodiment of the present invention.

With reference to FIG. 3, according to an embodiment, a pivot supporting structure 25 is provided to facilitate sensing the vertical force applied on the pivot supporting structure 25 by the linkage mechanism. The pivot supporting structure 25 can be fixed to the base of the circuit breaker as mentioned above (for example as shown in FIG. 1). The pivot supporting structure 25 comprises: a supporting body 251 having a supporting hole 2511 for receiving and pivotally supporting a pivot pin connected to a actuating mechanism of the circuit breaker (for example, the third lever 23).

The supporting body 251 further comprises a sensing hole 2512. At least one strain gauge (not shown) are mounted to the inner wall of the sensing hole 2512 for sensing the force acting on the pivot supporting structure by the actuating mechanism. The strain gauge can be any known element for sensing the stain of an object to which the strain gauge is mounted. Normally, the strain gauge is a sensitive grid made of conductive or semi-conductive material. This material is sensitive to force applied on it to deform such that its resistance value would change in responding to the deformation. After having mounted the strain gauge to the inner wall of the sensing hole 2512, the sensing hole 2512 can be sealed for example with glue.

The supporting body 251 defines a longitudinal direction Y and further comprises a mounting structure 2513 for fixing the supporting body 251 to the base of the circuit breaker, with the longitudinal direction Y of the supporting body 251 aligning with the vertical direction of the circuit breaker. In FIG. 3, the mounting structure 2513 is a pair of lugs with a hole on one end of the supporting body 251 in the longitudinal direction Y, such that the supporting body 251 can be fixed to the base of the circuit breaker by fastening screws through the holes on the lugs. In this case, the upper portion of the supporting body 251 (in FIG. 3) is fixed to the base of the circuit, while the lower portion of the supporting body 251 is suspended.

The sensing hole 2512 is arranged between the mounting structure 2513 and the supporting hole 2511 in the longitudinal direction Y. As a result, when a force in the longitudinal direction Y is applied on the supporting hole 2511, this force will be conducted to the base of the circuit through the portion of the supporting body 251 where the sensing hole 2512 locates, such that this portion of the supporting body 251 would deform in response to the applied force and the at least one gauge in the sensing hole 2512 can sense the deformation of this portion.

In order to amplify the deformation of the of the supporting body 251 to improve the sensitivity of the strain gauge, it is preferable to provide slots 2514 on the supporting body 251, so as to improve the flexibility of a portion of the supporting body 251 around the sensing hole 2512 under the force acting on the supporting hole 2511. Preferably, the width of the slots 2514 is 1.8 mm.

As can be seen in FIG. 3, the slots 2514 cut through the thickness of the supporting body 251, and can travel along both the longitudinal direction and the horizontal direction. By these slots, the lower portion of the supporting body 251 where the supporting hole 2511 locates is connected to the intermediate portion of the supporting body 251 where the sensing hole 2512 locates, only in a small region. Also by these slots, the intermediate portion of the supporting body 251 where the sensing hole 2512 locates is connected to the upper portion of the supporting body 251 only in a small region. As a result, when a force in the longitudinal direction Y is applied on the supporting hole 2511, the stress generated on the above two small regions would dramatically increase which causes a relative large deformation on the inner wall of the sensing hole 2512 (particularly on the upper wall and lower wall of the inner wall in the longitudinal direction Y). As a result, the strain gauge mounted to the inner wall of the sensing hole 2512 can sense a relative large deformation of the supporting body 251 under the same force value. Therefore, the sensitivity of the strain gauge is improved.

According to an embodiment, two tensile strain gauges for sensing the tensile force acting on the pivot supporting structure and two compressive strain gauges for sensing the compressive force acting on the pivot supporting structure are provided. The two tensile strain gauges are mounted to the inner wall of the sensing hole 2512 at one side in the longitudinal direction Y (upper or lower side in FIG. 3), with the two tensile strain gauges being symmetrical with respect to a virtual line which passes the center of the sensing hole 2512 and is parallel to the longitudinal direction Y, and the two compressive strain gauges are mounted to the inner wall of the sensing hole 2512 at another side in the longitudinal direction Y (lower or upper side in FIG. 3), with the two compressive strain gauges being symmetrical with respect to said virtual line. In this case, the two tensile strain gauges can equally sense the force in the longitudinal direction Y applied on the sensing hole 2512, which is also the case for the two compressive strain gauges. This is advantageous for accurately calculating or evaluating the value of the force, which will be discussed in detail later.

In case the connecting line between the sensing hole 2512 and the supporting hole 2511 is parallel to the longitudinal direction Y, and the two tensile/compressive strain gauges are arranged symmetrically with respect to the virtual line which passes the center of the sensing hole 2512 and is parallel to the longitudinal direction Y, the two tensile/compressive strain gauges would be symmetrical with respect to a virtual line which passes the center of the supporting hole 2511. This means the two tensile/compressive strain gauges would be symmetrical to the acting point of the vertical force applied by the pin the in the supporting hole 2511, which is advantageous to equally sense the force by the two tensile/compressive strain gauges.

It is appreciated that the slots 2514 can be formed on the supporting body 251 in other manners such that the other portions of the supporting body 251, for example the portion of the inner wall of the sensing hole 2512 along the longitudinal direction Y, is more flexible and more sensitive to the vertical force. In this case, the orientation of the strain gauges on the inner wall of the sensing hole 2512 should be adjusted to be suitable to sense the strain of the most flexible portion of the supporting body 251 so as to sense the vertical force. It is also appreciated that the shape and size of the sensing hole 2512 can be determined according to processing convenience and convenience for mounting the strain gauges, and are not critical to sense the force.

It is also appreciated that the strain gauges can be mounted to the supporting body 251 in any common manner. Normally, strain gauges are attached to a surface of an elastic portion of an object, for example, by glue. Therefore, the strain gauges can also be attached to the inner wall of the sensing hole 2512 by glue.

Figure 4:
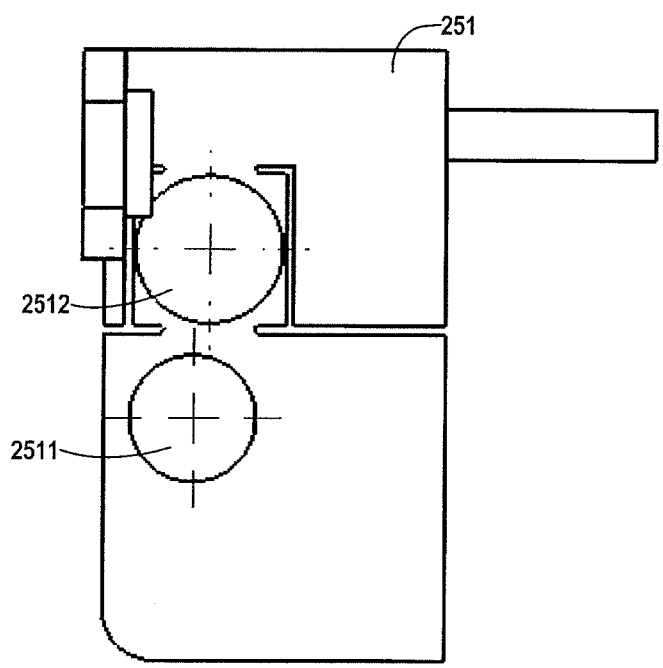
FIG. 4 illustrates a side view of the supporting body in FIG. 3.

With reference to FIG. 4, for other considerations such as assembling position of the pin or the dimension limit for the sensing hole 2512, there may be some distance between the virtual line passing through the center of the sensing hole 2512 and the virtual line passing through the center of the supporting hole 2511. In this case, the two tensile/compressive strain gauges are also arranged symmetrically with respect to the virtual line which passes the center of the sensing hole 2512 to substantially equally sense the deformation on the inner wall of the sensing hole 2512, while the small offset of the center of the supporting hole 2511 relative to the center of the supporting hole 2511 would not significantly affect the accuracy of the sensing result of the strain gauges.

Figure 5:
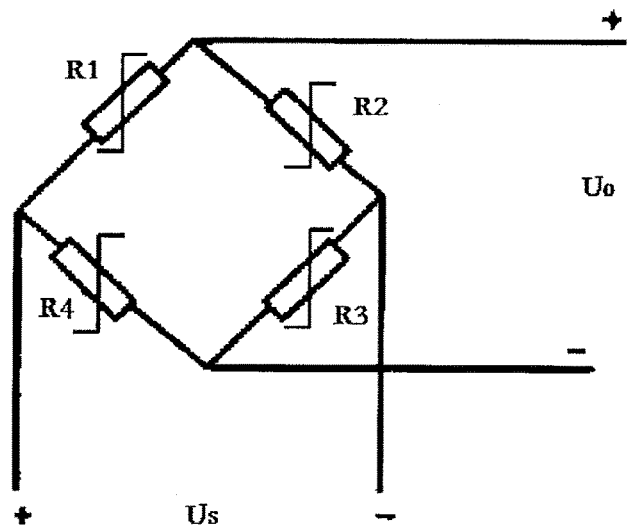
FIG. 5 illustrates a Wheatstone bridge consisting of four strain gauges.

With reference to FIG. 5, according to an embodiment, the two tensile strain gauges and the two compressive strain gauges are connected as a Wheatstone bridge. In this bridge, the two tensile strain gauges are not connected directly, and the two compressive strain gauges are not connected directly either. In other words, the two tensile strain gauges may correspond to R1 and R3 in FIG. 5 respectively, and the two compressive strain gauges may correspond to R2 and R4 respectively; or the two tensile strain gauges may correspond to R2 and R4 in FIG. 5 respectively, and the two compressive strain gauges may correspond to R1 and R3 respectively. R1-R4 represent the variable resistance of the four strain gauges in response to the force in the longitudinal direction Y applied on the supporting body 251.

As is known in the art for the Wheatstone bridge, a voltage source $U_0$ is applied on two ends of the bridge, and a voltage meter or a current meter is connected between the middle points of the two bridge arms to measure the potential difference Us between the two middle points of the two bridge arms. According to known electrical theory, Us can be calculated from the following equation (5):

$$Us = \frac{U_0 R4}{R1 + R4} - \frac{U_0 R3}{R2 + R3} \quad (5)$$

If the two tensile strain gauges are identical and placed to equally sense the force, and the two compressive strain gauges are identical and placed to equally sense the force, it can assume that R1=R3, and R2=R4. In this case, the equation (5) can be simplified as $$Us = U_0 \cdot \left(1 - \frac{2R1}{R1 + R2}\right) \quad (6)$$

When a force in the longitudinal direction Y is applied on the supporting body 251 (which may be a tensile force or a compressive force for the four strain gauges), only the two strain gauges corresponding to the direction of the force (tensile or compressive) would be deformed in the current moment, while the other two strain gauges would not be deformed in response to this force. In other words, the resistance value of only one of R1 (R3) and R2 (R4) would change in a certain moment, with the other one remaining unchanged. In this case, the potential difference $U_S$ would change in response to the changing value of the force, which can also be reflected in equation (5) or (6).

By measuring the potential difference $U_S$ with voltage meter or current meter, the changed resistance value of R1 or R2 can be calculated with the measured Us and the unchanged initial value of R2 or R1, according to equation (6). Further with some calibrations, the precious relations between the applied force and the resistance value of R1 or R2 can be obtained. As a result, the force in the longitudinal direction Y applied on the supporting body 251 can be determined based on the deformation of the strain gauges.

The providing of both the tensile strain gauges and the compressive strain gauges allows the measuring of the force in two opposing directions along the longitudinal direction Y, which may be advantageous to research the mechanical characteristics. With the determined force value in the longitudinal direction Y applied on the supporting body 251, the contact force F2 can be calculated according to the methods as discussed above, and other mechanical characteristics related to the contact force F2 can also be determined.

It is appreciated that only one kind of strain gauges can also be used to sense both the tensile force and the compressive force. In this case, only a couple of such strain gauges are needed, with the other two strain gauges can be omitted. For the Wheatstone bridge as shown in FIG. 5, R1 and R3, or, R2 and R4 would be replaced with constant resistor.

It can be seen from equations (5) and (6) that the providing of two tensile or compressive strain gauges amplifies the potential difference Us compared with only one tensile or compressive strain gauge, which improves the sensitivity of sensing the force. However, it is appreciated that only one tensile or compressive strain gauge can also be used to sense the force, with the omitted one replaced with a constant resistor in the Wheatstone bridge as shown in FIG. 5.

It is also appreciated that the force can also be determined based on the deformation of the strain gauges in other ways. For example, the strain gauges can be connected to other more complex circuits, such that the change of the resistance of the strain gauges can be measured more preciously.

Figure 6:
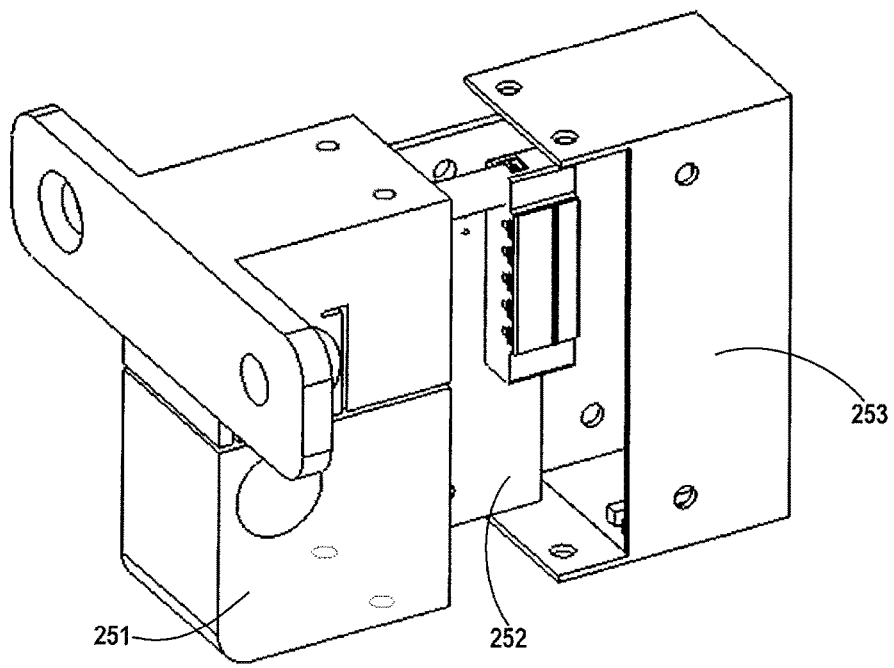
FIG. 6 illustrates the pivot supporting structure of FIG. 3, in which a printed circuit board is assembled, and a holder is detached.
Figure 7:
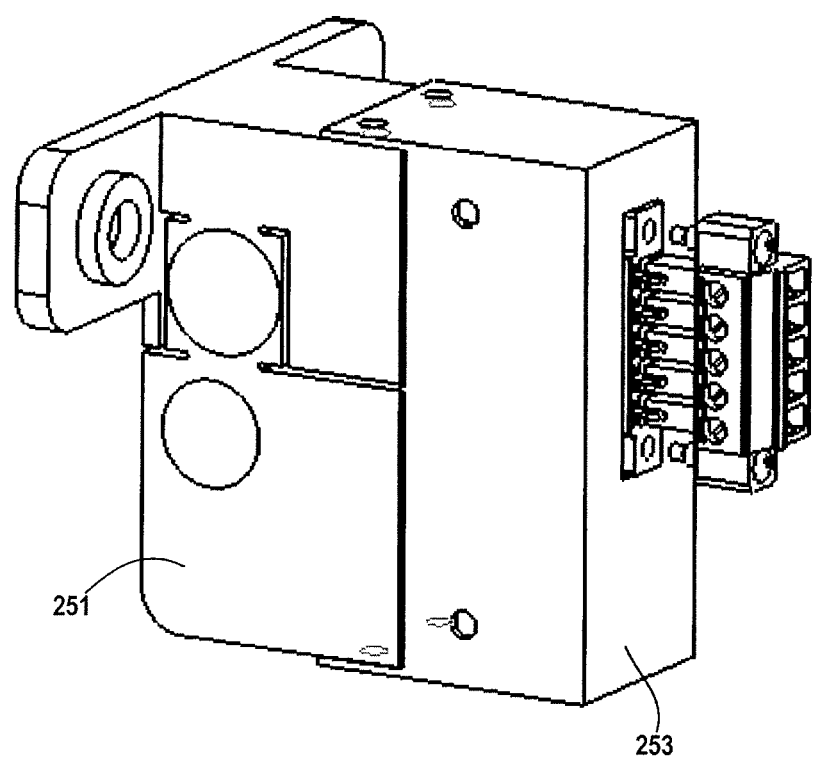
FIG. 7 illustrates the pivot supporting structure of FIG. 3, in which a printed circuit board and a holder are assembled.

With reference to FIG. 6, according to an embodiment, the pivot supporting structure 25 further comprises a printed circuit board 252. The printed circuit board 252 is electrically connected to the strain gauges with cables 2515 (see FIG. 3) extending from the interior of the supporting body 251 out of the supporting body 251. The printed circuit board 252 can form the above Wheatstone bridge or other measuring circuit with the strain gauges, and can comprise hardware for calculating the value of the force acting on the pivot supporting structure based on the variation in the resistance of the at least one strain gauge, such as power source, MCU, memory and signal filter. The printed circuit board 252 can also comprise a communication module to transmit the calculated value of the force to other devices, such as RS485 communication ports.

According to an embodiment, the printed circuit board 252 is fixed to the supporting body 251. For example, a portion of the printed circuit board 252 can be inserted into a slot 2516 (see FIG. 3) on the supporting body 251. The pivot supporting structure 25 may further comprise a holder 253 to further house and support the printed circuit board 252. The holder 253 can be further fixed to the supporting body 251 with screws. As a result, the printed circuit board 252 is firmly fixed to the supporting body 251 and is protected by the holder 253.

Since the printed circuit board 252 is integrated with the supporting body 251 to form a module, the signal from the sensing circuit can be processed to obtain the force value at the sensing field. As a result, the analog signal from the sensing circuit does not need to be transmitted to a distal device, otherwise the analog signal may decay or some noise may be induced during the transmitting which may seriously affect the accuracy of calculating the force value. After being processed at the sensing field, the output digital signal representing the determined force value can be transmitted farther with less distortion, and the transmitting would not affect the force value represented by the digital signal. Therefore, the received force value by the distal device would be more accurate, which is advantageous for analyzing the mechanical characteristics of the circuit breaker.

According to an embodiment, the printed circuit board 252 is further configured to calculate a contact force applied on a movable contact of the circuit breaker and/or evaluate the closing and opening time point of the circuit breaker, based on the calculated value of the force acting on the pivot supporting structure. This can be realized according to the calculating or evaluating method aforementioned.

According to an embodiment, the communication module of the printed circuit board 252 can comprise additional communication ports (such as RS485 ports) to receive and forward outputs from another device. For example, the force sensor mounted on other position of this circuit breaker or another pivot supporting structure according to embodiments of the present invention for another circuit breaker can be connected to the additional communication ports on the printed circuit board 252. In this case, the communication module in this printed circuit board 252 can not only transmit the data generated from the pivot supporting structure to which the printed circuit board 252 belongs, it can also forward the sensed data from other devices. In this way, multiple sensors can be connected in series, and only one sensor in one end of the sensor string is connected to an upper machine to transmit data from all the sensors in this string to the upper machine. This simplify the connection between the multiple sensors and the upper machine, and is particular advantageous for sensing a circuit breaker in multiple positions or sensing multiple circuit breakers with one upper machine. In an embodiment, each of the sensors in series can be the pivot supporting structure according an embodiment of the present invention.

According to an embodiment, the circuit breaker can further comprise a data processing unit connected to the pivot supporting structure. The data processing unit is configured to calculate a contact force applied on the movable contact of the circuit breaker and/or evaluate the closing and opening time point of the circuit breaker, based on the value of the sensed force from the pivot supporting structure. This calculation or evaluation can also be realized according to the calculating or evaluating method aforementioned.

It is noted that the pivot supporting structure should be fixed to the circuit breaker with the longitudinal direction Y of the supporting body 251 being parallel to the vertical direction of the circuit breaker (i.e. the moving direction of the movable contact of the circuit breaker). Being disposed in this orientation, the pivot supporting structure 25 can sense the force in the vertical direction relative to the base of the circuit breaker acting on the pivot supporting structure by the lever of the actuating mechanism.

For all the embodiments of the present invention as described, the accurate time point of closing or opening of the circuit breaker can be determined by sensing the characteristic forces related to the contact force F2 at a position away from the movable contact. As a result, the sensing electronics and the sensing process would not be impacted by the severe environment near the movable contact, if the circuit breaker is in normal operation. Therefore, the method and pivot supporting structure according to the embodiments of the present invention can be used to on-line monitor the circuit breaker, without the need of a safe testing environment. The on-line monitoring can reflect the practical operating performance of the circuit breaker. Compared to the monitoring in the off-line environment or testing environment, the on-line monitoring is more useful for the user to study the performance of the circuit breaker. In addition, since the on-line monitoring does not need to interrupt the normal operation of the circuit breaker, the monitoring can be taken regularly for a long time, which is advantageous for the maintenance of the circuit breaker.

Since the force sensor is integrated with the supporting structure of the actuating mechanism of the circuit breaker and the sensor and the supporting structure would not move during the operation of the circuit breaker, the sensing result would be more accurate, and the sensor can withstand larger times of operations. In addition, since the sensor is not mounted to any movable actuating element, the disassembling of the sensor would not change the mechanical characteristics of the circuit breaker, and thus the sensor is easy for maintenance.

Based on the accurate determination of the closing and opening time point of the circuit breaker, other mechanical characters of the circuit breaker can also be computed or evaluated. For example, the speed of closing and opening of the circuit breaker can be computed based on the starting point for sending the instruction and the determined closing or opening time point. In addition, the contact opening gap and the contact spring stroke of the circuit breaker can also be obtained based on the closing and opening time point. Therefore, the methods and pivot supporting structure according to the embodiments of the present invention provide a basis for the accurate monitoring to the mechanical characters of the circuit breaker.

It is also appreciated that the pivot supporting structure according to the embodiments of the present invention are also adapted for various kinds of circuit breakers, including the circuit breakers for high, medium and low voltage level, the circuit breakers with different actuating mechanisms.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein By studying the drawings, the disclosure of the embodiments of the present disclosure, and the mounted Claims, those skilled in the art may understand and implement other modifications of the disclosed embodiments during the implementation of the present disclosure. In the claims, "comprising" does not exclude other elements or steps, and "a" or "one" does not exclude the plural concept. The simple fact of illustrating specific elements in the dependent claims, which are mutually different from each other, does not indicate that the combination of these elements cannot be used advantageously. The labels in drawings of the claims should not be interpreted as limiting the scopes thereof.

Though the present disclosure has been described with reference to the currently considered embodiments, it should be appreciated that the present disclosure is not limited the disclosed embodiments. On the contrary, the present disclosure is intended to cover various modifications and equivalent arrangements falling within in the spirit and scope of the appended claims. The scope of the appended claims is accorded with broadest explanations and covers all such modifications and equivalent structures and functions.

What is claimed is:
1. A pivot supporting structure for a circuit breaker, comprising:
    a supporting body having a supporting hole for receiving and pivotally supporting a pivot pin connected to an actuating mechanism of the circuit breaker, wherein at least one strain gauge is mounted to the supporting body for sensing a force acting on the pivot supporting structure by the actuating mechanism;

wherein the supporting body further comprises a sensing hole, and the at least one strain gauge is mounted to an inner wall of the sensing hole;

wherein the at least one strain gauge comprises two tensile strain gauges for sensing a tensile force acting on the pivot supporting structure and two compressive strain gauges for sensing a compressive force acting on the pivot supporting structure; and wherein the two tensile strain gauges and the two compressive strain gauges are mounted to the inner wall of the sensing hole in an orientation such that they are adapted to sense the force in a longitudinal direction (Y).

2. The pivot supporting structure according to claim 1, wherein the supporting body defines the longitudinal direction (Y) and further comprises a mounting structure for fixing the supporting body to the circuit breaker, with the longitudinal direction of the supporting body aligning with a vertical direction of the circuit breaker; and wherein the sensing hole is arranged between the mounting structure and the supporting hole in the longitudinal direction (Y).

3. The pivot supporting structure according to claim 1, wherein the two tensile strain gauges are mounted to the inner wall of the sensing hole at one side in the longitudinal direction (Y), with the two tensile strain gauges being symmetrical with respect to a virtual line which passes through a center of the sensing hole and is parallel to the longitudinal direction (Y), and the two compressive strain gauges are mounted to the inner wall of the sensing hole at another side in the longitudinal direction (Y), with the two compressive strain gauges being symmetrical with respect to said virtual line.

4. The pivot supporting structure according to claim 3, wherein the pivot supporting structure further comprises a printed circuit board connected and fixed to the supporting body; and wherein the printed circuit board is configured to calculate a value of a force acting on the pivot supporting structure based on a variation in a resistance of the at least one strain gauge and transmit the value of the force.

5. The pivot supporting structure according to claim 4, wherein the printed circuit board is further configured to calculate a contact force applied on a movable contact of the circuit breaker and/or evaluate a closing and an opening time point of the circuit breaker, based on the calculated value of the force acting on the pivot supporting structure.

6. The pivot supporting structure according to claim 1, wherein the two tensile strain gauges and the two compressive strain gauges are connected as a Wheatstone bridge, with the two tensile strain gauges being not connected directly, and the two compressive strain gauges being not connected directly.

7. The pivot supporting structure according to claim 6, wherein the pivot supporting structure further comprises a printed circuit board connected and fixed to the supporting body; and wherein the printed circuit board is configured to calculate a value of a force acting on the pivot supporting structure based on a variation in a resistance of the at least one strain gauge and transmit the value of the force.

8. The pivot supporting structure according to claim 7, wherein the printed circuit board is further configured to calculate a contact force applied on a movable contact of the circuit breaker and/or evaluate a closing and an opening time point of the circuit breaker, based on the calculated value of the force acting on the pivot supporting structure.

9. The pivot supporting structure according to claim 1, wherein a plurality of slots are arranged on the supporting body to improve the flexibility of a portion of the supporting body around the sensing hole under the force acting on the supporting hole.

10. The pivot supporting structure according to claim 1, wherein the pivot supporting structure further comprises a printed circuit board connected and fixed to the supporting body; and wherein the printed circuit board is configured to calculate a value of a force acting on the pivot supporting structure based on a variation in a resistance of the at least one strain gauge and transmit the value of the force.

11. The pivot supporting structure according to claim 10, wherein the printed circuit board is further configured to calculate a contact force applied on a movable contact of the circuit breaker and/or evaluate a closing and an opening time point of the circuit breaker, based on the calculated value of the force acting on the pivot supporting structure.

12. The pivot supporting structure according to claim 10, wherein the printed circuit board is further configured to receive and forward outputs from another device connected to a communication port of the printed circuit board.

13. The pivot supporting structure according to claim 10, wherein the pivot supporting structure further comprises a holder to further support and protect the printed circuit board.

14. A circuit breaker, comprising:

an actuating mechanism for actuating a movable contact of the circuit breaker; and a pivot supporting structure comprising a supporting body having a supporting hole for receiving and pivotally supporting a pivot pin connected to an actuating mechanism of the circuit breaker;

at least one strain gauge mounted to the supporting body for sensing a force acting on the pivot supporting structure by the actuating mechanism; and wherein the supporting body of the pivot supporting structure is fixed to a base of the circuit breaker, and the supporting hole of the pivot supporting structure is coupled to a lever of the actuating mechanism via a pin;

wherein the supporting body further comprises a sensing hole, and the at least one strain gauge is mounted to an inner wall of the sensing hole;

wherein the at least one strain gauge comprises two tensile strain gauges for sensing a tensile force acting on the pivot supporting structure and two compressive strain gauges for sensing a compressive force acting on the pivot supporting structure; and wherein the two tensile strain gauges and the two compressive strain gauges are mounted to the inner wall of the sensing hole in an orientation such that they are adapted to sense the force in a longitudinal direction.

15. The circuit breaker according to claim 14, wherein the pivot supporting structure is fixed to the circuit breaker so as to sense the force in a vertical direction relative to the base of the circuit breaker acting on the pivot supporting structure by the lever of the actuating mechanism.

16. The circuit breaker according to claim 14, wherein the circuit breaker further comprises a data processing unit connected to the pivot supporting structure; and the data processing unit is configure to calculate a contact force applied on the movable contact of the circuit breaker and/or evaluate the closing and opening time point of the circuit breaker, based on the value of the sensed force from the pivot supporting structure.

17. The pivot supporting structure according to claim 14; and wherein the supporting body defines the longitudinal direction and further comprises a mounting structure for fixing the supporting body to the circuit breaker, with the longitudinal direction of the supporting body aligning with the vertical direction of the circuit breaker; and wherein the sensing hole is arranged between the mounting structure and the supporting hole in the longitudinal direction (Y).

* * * * *